(12) United States Patent
Wu

(10) Patent No.: US 9,055,669 B2
(45) Date of Patent: Jun. 9, 2015

(54) DISPLAY DEVICE PACKAGE AND PACKAGING PROCESS THEREOF

(71) Applicant: Au Optronics Corporation, Hsinchu (TW)

(72) Inventor: Wen-Hao Wu, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 95 days.

(21) Appl. No.: 13/891,206

(22) Filed: May 10, 2013

(65) Prior Publication Data

US 2013/0242512 A1 Sep. 19, 2013

Related U.S. Application Data

(63) Continuation of application No. 12/795,649, filed on Jun. 7, 2010, now abandoned.

(30) Foreign Application Priority Data

Apr. 13, 2010 (TW) .............................. 99111443 A

(51) Int. Cl.
*B44F 1/00* (2006.01)
*C09K 11/00* (2006.01)
(Continued)

(52) U.S. Cl.
CPC .............. *H05K 1/02* (2013.01); *B29C 65/1635* (2013.01); *B29C 65/48* (2013.01); *B29C 65/486* (2013.01);
(Continued)

(58) Field of Classification Search
CPC ........... H05B 33/10; H01J 9/00; B29C 65/00; B29C 65/14; B29C 65/16; B29C 65/1635; B29C 65/48; B29C 65/486; B29C 65/4885; C09J 1/00; C09J 2400/14; B32B 37/00; B32B 37/0076; B32B 37/12; B32B 37/1238; H01L 51/5012; H01L 27/32

USPC ........... 156/60, 67, 89.11, 89.12, 90, 99, 100, 156/104, 106, 107, 272.2, 272.8, 273.3, 156/273.5, 273.7, 275.5, 275.7, 283, 290, 156/291, 292; 313/504, 512
See application file for complete search history.

(56) References Cited

U.S. PATENT DOCUMENTS

2007/0170861 A1* 7/2007 Lee et al. ...................... 313/512
2007/0232182 A1* 10/2007 Park ................................ 445/25
2009/0206739 A1* 8/2009 Lee et al. ...................... 313/504

FOREIGN PATENT DOCUMENTS

TW 200730007 8/2007

OTHER PUBLICATIONS

"Office Action of Taiwan Counterpart Application", issued on Aug. 23, 2013, p. 1-p. 8.

*Primary Examiner* — Philip Tucker
*Assistant Examiner* — Brian R Slawski
(74) *Attorney, Agent, or Firm* — Jianq Chyun IP Office

(57) ABSTRACT

An display device package including a first substrate, an display device, a second substrate, a welding glue, and a first adhesive layer is provided. The display device is disposed on the first substrate. The second substrate is disposed above the first substrate and the display device. The welding glue is welded with the first substrate and the second substrate and surrounds the display device, wherein the welding glue has a continuous pattern. The first adhesive layer is adhered to the first substrate and the second substrate, wherein the first adhesive layer is disposed between the display device and the welding glue and surrounds the display device, and the material of the first adhesive layer and the material of the welding glue are different.

3 Claims, 6 Drawing Sheets

(51) Int. Cl.
*H01J 9/227* (2006.01)
*B29C 65/00* (2006.01)
*B32B 37/00* (2006.01)
*B32B 38/04* (2006.01)
*H01J 1/62* (2006.01)
*H01J 63/04* (2006.01)
*H05K 1/02* (2006.01)
*C09J 5/00* (2006.01)
*H01L 51/52* (2006.01)
*H05K 1/18* (2006.01)
*B29C 65/16* (2006.01)
*B29C 65/48* (2006.01)
*B32B 37/12* (2006.01)
*G02F 1/1333* (2006.01)

(52) U.S. Cl.
CPC ......... *B29C 65/4885* (2013.01); *B32B 37/0076* (2013.01); *B32B 2037/1238* (2013.01); *C09J 5/00* (2013.01); *C09J 2201/28* (2013.01); *C09J 2201/36* (2013.01); *C09J 2203/318* (2013.01); *G02F 1/133351* (2013.01); *G02F 2001/133311* (2013.01); *H01L 51/5246* (2013.01); *H05K 1/181* (2013.01)

DISPLAY DEVICE PACKAGE AND PACKAGING PROCESS THEREOF

CROSS-REFERENCE TO RELATED APPLICATION

This application is a continuation application of and claims the priority benefit of a prior application Ser. No. 12/795,649, filed on Jun. 7, 2010, now abandoned. The prior application Ser. No. 12/795,649 claims the priority benefit of Taiwan application serial no. 99111443, filed on Apr. 13, 2010. The entirety of the above-mentioned patent applications is hereby incorporated by reference herein and made a part of this specification.

BACKGROUND OF THE INVENTION

1. Field of the Invention

The invention relates generally to a display device package and a packaging process thereof. More particularly, the invention relates to a display device package capable of effective moisture prevention and a packaging process of the display device package.

2. Description of Related Art

With booming development of electronic products and increasing demands of portable electronic products, more and more attention has been paid to the performance of displays on the electronic products in terms of response speed, high resolution, and satisfactory image quality. Besides focusing on multi-functional properties, research and development of the electronic products are mainly geared towards light weight and compactness. Since an electro-luminescent display is a self-emissive display in no need of a backlight module, the electro-luminescent display satisfies the requirements of light weight and compactness for the electronic products.

Generally, in order to prevent moisture and air from deteriorating a device reliability of the display device, the electro-luminescent display usually employs ultraviolet curable sealants and desiccating agents to prevent moisture from entering a package of the electro-luminescent display. Moreover, nowadays a common electro-luminescent display further adopts a laser sealing technique and a glass frit to achieve the effect of moisture prevention. More specifically, in the laser sealing technique, a laser is used to heat and melt the glass frit disposed between an array substrate and a cover glass, so that the array substrate and the cover glass are tightly adhered together by the glass frit. Due to a superior water-resistant property of the glass frit, moisture can be effectively prevented from entering the package of the electro-luminescent display.

However, the glass frit between the array substrate and the cover glass is substantially an adhesion interface of heterogeneous materials. Hence an issue of unfavorable adhesion is achieved for the glass frit between the array substrate and the cover glass. Therefore, moisture enters the package of the electro-luminescent display through the gaps between the glass frit and the array substrate or that between the glass frit and the cover glass, thereby affecting the electrical characteristics of the electro-luminescent display.

SUMMARY OF THE INVENTION

The embodiment of the present invention provides a display device package and a packaging process thereof, capable of effectively preventing moisture from entering the package.

The embodiment of the present invention provides a display device package, including a first substrate, a display device, a second substrate, a welding glue, and a first adhesive layer. The display device is disposed on the first substrate. The second substrate is disposed above the first substrate and the display device. The welding glue welds with the first substrate and the second substrate, and the welding glue surrounds the display device. Moreover, the welding glue has a continuous pattern. The first adhesive layer is adhered to the first substrate and the second substrate, in which the first adhesive layer is disposed between the display device and the welding glue, and the first adhesive layer surrounds the display devices. Furthermore, the material of the first adhesive layer is different from the material of the welding glue.

The embodiment of the present invention provides a packaging process of a display device. First, provide a first substrate having a display device formed thereon. Thereafter, form a welding glue and a first adhesive layer on a second substrate. Moreover, the welding glue is welded with the second substrate, and the welding glue has a continuous pattern. Next, join the first substrate and the second substrate with at least one of the first adhesive layer and the welding glue. The welding glue and the first adhesive layer surround the display device, and the first adhesive layer is disposed between the display device and the welding glue. Furthermore, the material of the first adhesive layer is different from the material of the welding glue.

The embodiment of the present invention further provides a packaging process of a display device. First, provide a first substrate having a display device formed thereon. Thereafter, form a welding glue, a first adhesive layer, and a second adhesive layer on a second substrate. The welding glue is welded with the second substrate, and the welding glue has a continuous pattern. Next, join the first substrate and the second substrate with at least one of the welding glue, the first adhesive layer, and the second adhesive layer. The welding glue, the first adhesive layer, and the second adhesive layer surround the display device. The first adhesive layer is disposed between the display device and the welding glue, the welding glue is disposed between the first adhesive layer and the second adhesive layer, and the material of the first adhesive layer is different from the material of the welding glue.

The embodiment of the present invention provides a display device package, including a first substrate, a display device, a second substrate, a welding glue, and a first adhesive layer. The display device is disposed on the first substrate. The second substrate is disposed above the first substrate and the display device. The welding glue welds with the first substrate and the second substrate, and the welding glue surrounds the display device. Moreover, the welding glue has a continuous pattern. The first adhesive layer is adhered to the first substrate and the second substrate. The first adhesive layer substantially surrounds the display device and has a discontinuous pattern. Moreover, the discontinuous pattern includes three or more openings.

In summary, according to embodiments of the present invention, the display device package employs the welding glue and the adhesive layer to adhere the first substrate and the second substrate, so as to strengthen the adhesion between the substrates and the welding glue. Accordingly, moisture can be effectively prevented from entering the display device package, and thereby the display device may obtain a preferable electrical characteristic.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
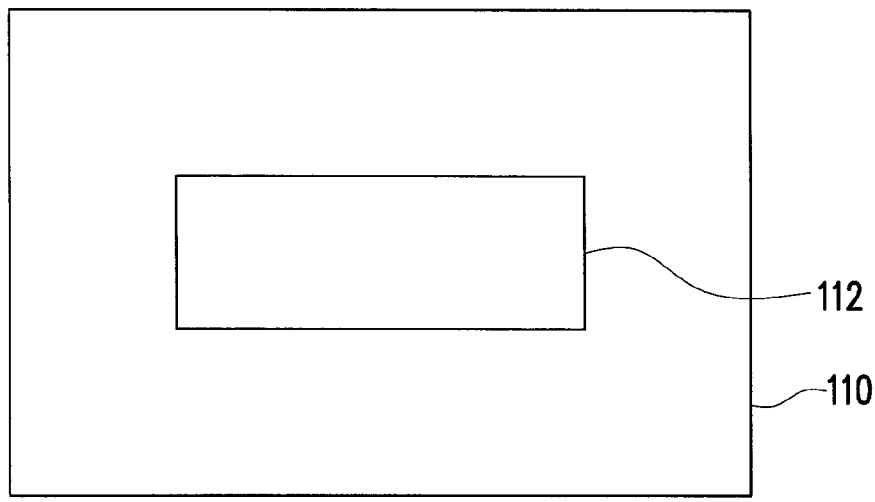
FIGS. 1A-1C are schematic views illustrating the steps of a packaging process of an display device in accordance with an embodiment of the invention.
Figure 1B:
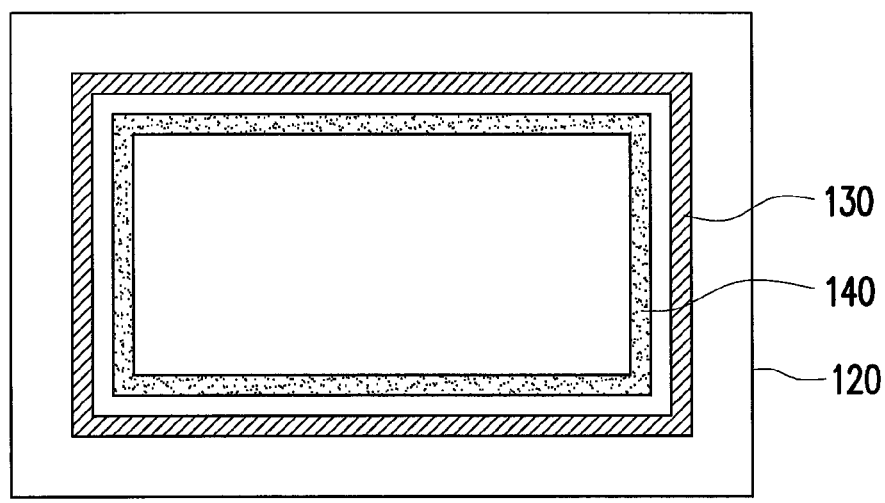
Figure 1C:
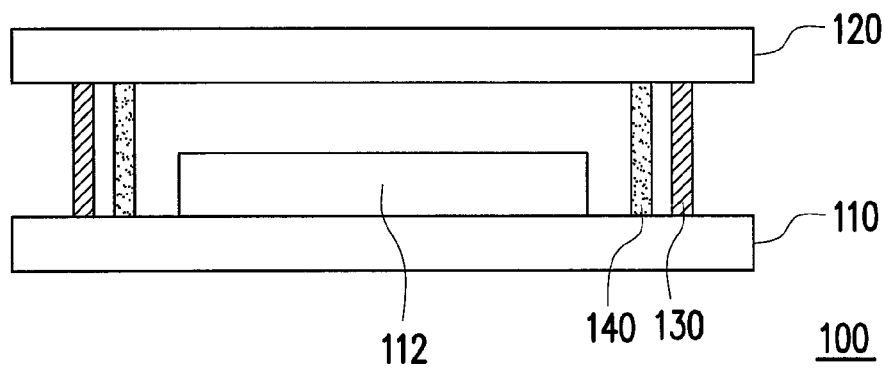

FIGS. 1A-1C are schematic views illustrating the steps of a packaging process of an display device in accordance with an embodiment of the invention. Referring to FIG. 1A, a first substrate 110 on which a display device 112 is formed is provided at first. In the present embodiment, the first substrate 110 with the display device 112 formed thereon is a flat panel display or a plane light source, for example. For instance, the first substrate 110 with the display device 112 formed thereon is exemplarily electro-luminescent display panel such as an active matrix organic electro-luminescent display panel (AM-OLED panel) or a passive matrix organic electro-luminescent display panel (PM-OLED panel). However, other suitable display panel may be applied in the embodiments of the present invention, for example, an electro-phoretic display panel (EPD panel). The display device of the present embodiment is exemplarily a display device, but not limited thereto. The display device may be an organic light emitting display device, an inorganic light emitting display device, or an electro-phoretic display device, or the combinations thereof.

Referring to FIG. 1B, thereafter a welding glue 130 and a first adhesive layer 140 is formed on a second substrate 120, in which the welding glue 130 is welded with the second substrate, and the welding glue 130 has a continuous pattern. More specifically, first a welding material (not drawn) is formed on the second substrate 120, and the welding material is then cured to form a welding glue 130 on or welded with the second substrate 120. After the welding material is cured, the first adhesive layer 140 is formed on the second substrate 120. In the present embodiment, the second substrate 120 is, for example, a transparent substrate such as a glass substrate, a plastic substrate, or a substrate made of other materials. The welding glue 130 is a glass frit, for example, and the welding glue 130 is cured by laser welding, for instance. The continuous pattern formed by the welding glue 130 is a closed pattern having a rectangular shape as shown in FIG. 1B or other suitable shapes. The first adhesive layer 140 is formed inside of or enclosed by the welding glue 130, and the first adhesive layer 140 has a continuous pattern, for example, with the rectangular shape as shown in FIG. 1B, or other suitable shapes. In the present embodiment, the material of the first adhesive layer 140 comprises a photo-curable material, a thermal curable material, or a self-curable material. The material of the welding glue 130 and the first adhesive layer 140 are exemplarily different from each other. It should be noted that embodiments of the invention do not restrict a formation sequence of the welding glue 130 and the first adhesive layer 140. In other words, in other embodiments of the invention, the first adhesive layer 140 may be formed first, and then the welding glue 130 is formed.

Referring to FIG. 1C, thereafter the welding glue 130 and the first adhesive layer 140 are adhered to the first substrate 110. That is, join the first substrate 110 and the second substrate 120 with at least one of the welding glue 130 and the first adhesive layer 140. The welding glue 130 and the first adhesive layer 140 substantially surround the display device 112, and the first adhesive layer 140 is disposed between the display device 112 and the welding glue 130. In the present embodiment, the welding glue 130 and the first adhesive layer 140 may be adhered to the first substrate 120 by first curing the first adhesive layer 140, so that the second substrate 120 is adhered to the first substrate 110. After the first adhesive layer 140 is cured, melt the welding glue 130 so that the welding glue 130 is then welded with the first substrate 110. According to the material characteristic of the first adhesive layer 140, the first adhesive layer 140 may be cured by an irradiation process, a heating process, a desiccating process, or other suitable processes. The welding glue 130 is welded with the first substrate 110 by a laser irradiation process, for example. In other words, according to the present embodiment, by first curing the first adhesive layer 140 so that the first substrate 110 and the second substrate 120 may be slightly adhered with each other, then melting the welding glue 130 to weld the welding glue 130 with the first substrate 110, an adhesion between the first substrate 110 and the second substrate 120 is further strengthened. An advantage of curing the first adhesion layer 140 and melting the welding glue 130 in the above-described order is that, during the process of curing the first adhesive layer 140 to adhere the first substrate 110 and the second substrate 120, a cell gap between the first substrate 110 and the second substrate 120 is maintained by the welding glue 130 because the welding glue 130 is cured in a previous step. Moreover, in the process of welding the welding glue 130 with the first substrate 110, the cured first adhesive layer 140 can maintain the cell gap between the first substrate 110 and the second substrate 120. Accordingly, an issue of an irregular cell gap produced during the adhesion process of the first substrate 110 and the second substrate 120 may be mitigated.

Figure 2A:
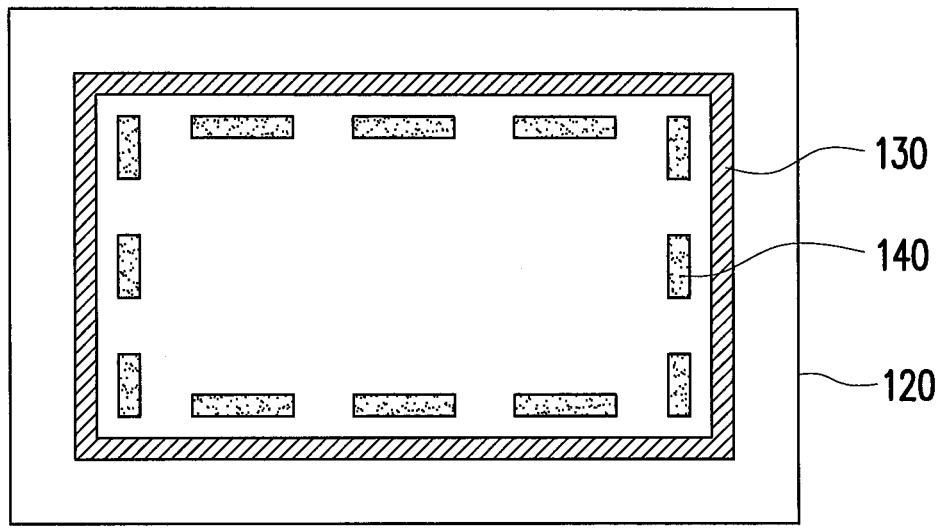
FIGS. 2A and 2B are respective schematic top views of a second substrate of a display device package in accordance with an embodiment of the invention.
Figure 2B:
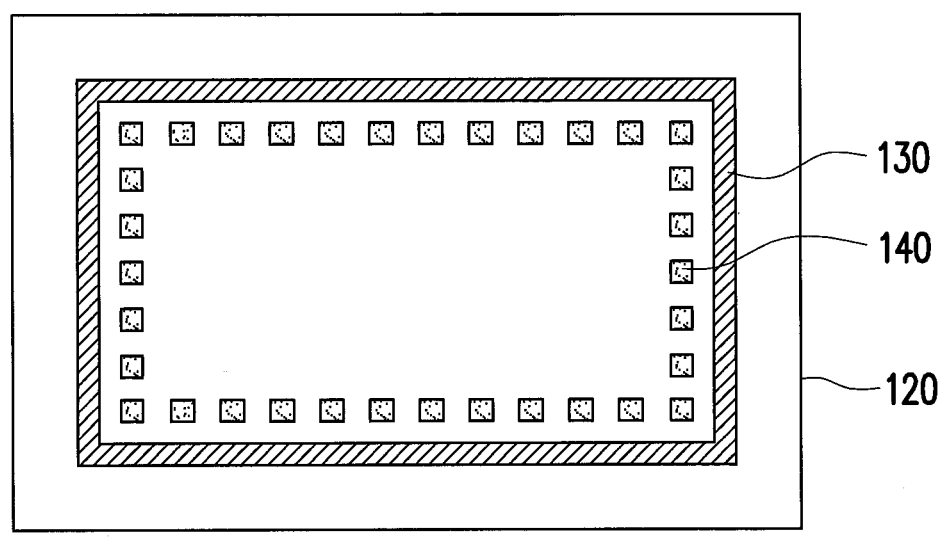

Referring to FIGS. 1B and 1C, a display device package 100 includes the first substrate 110, the display device 112, the second substrate 120, the welding glue 130, and the first adhesive layer 140. The display device 112 is disposed on the first substrate 110. The second substrate 120 is disposed above the first substrate 110 and the display device 112. The welding glue 130 welds with the first substrate 110 and the second substrate 120, and the welding glue 130 surrounds the display device 112. Moreover, the welding glue 130 has a continuous pattern. The first adhesive layer 140 is adhered to the first substrate 110 and the second substrate 120, in which the first adhesive layer 140 is disposed between the display device 112 and the welding glue 130, and the first adhesive layer 140 surrounds the display device 112. It should be noted that, according to the present embodiment, although the first adhesive layer 140 has, for example, the continuous pattern, but in other embodiments of the invention, the first adhesive layer 140 may have a discontinuous pattern, and the discontinuous pattern may include three or more openings. For example, as shown in FIG. 2A, on the second substrate 120 of the display device package 100 according to an embodiment of the invention, the first adhesive layer 140 can have a discontinuous pattern, and the discontinuous pattern includes a plurality of strip patterns, for example. As shown in FIG. 2B, on the second substrate 120 of the display device package 100 according to an embodiment of the invention, the first adhesive layer 140 can have a discontinuous pattern, and the discontinuous pattern includes a plurality of dot patterns, for example. In other words, embodiments of the invention do not limit the pattern of the first adhesive layer 140.

In the present embodiment, the display device package 100 employs the welding glue 130 and the adhesive layer 140 to adhere the first substrate 110 and the second substrate 120, so as to strengthen the adhesion between the substrates 110 and 120 and the welding glue 130. Accordingly, moisture can be effectively prevented from entering the display device package 100, and thereby the display device 112 may obtain a preferable electrical characteristic. Moreover, the substrates 110 and 120 generally have a property of thermal expansion or contraction due to heat or cold, therefore, after the welding glue 130 is laser welded for example, a stress may still reside in the adhesion interface between the welding glue 130 and the substrates 110 and 120, thereby effecting the adhesion of the welding glue 130 between the substrates 110 and 120, and even causing the failure of the package. However, in the present embodiment, since a discontinuous pattern of the adhesive layer 140 is formed inside of the welding glue 130, in which the discontinuous pattern may include three or more openings, the adhesive layer 140 may act as a buffer against the thermal expansion and contraction of the substrates 110 and 120, so as to reduce the influence on the adhesion of the welding glue 130 between the substrates 110 and 120, and to increase a total adhesion area with the substrates 110 and 120. Therefore, the adhesion of the substrates 110 and 120 and the welding glue 130 is drastically increased, while a failure possibility of the package is lowered. Furthermore, due to the larger total adhesion area of the welding glue 130 and the adhesive layer 140 between the substrates 110 and 120, a preferable supportability is provided for the substrates 110 and 120. Hence, when the display device package 100 according to the present embodiment is applied in a large scale product, the upper and lower substrates are prevented from scratching and damaging the display device due to insufficient supportability. In other words, the display device package in the present embodiment may also increase the yield rate and the reliability.

Figure 3A:
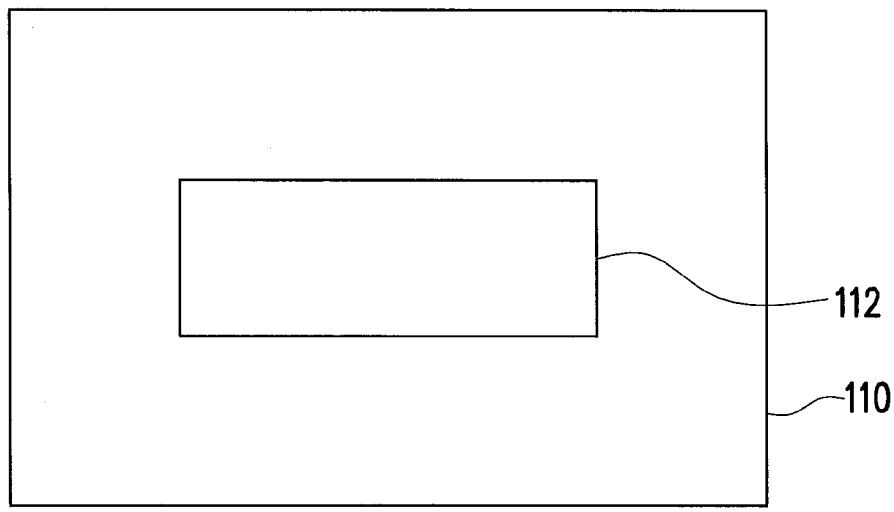
FIGS. 3A-3C are schematic views illustrating the steps of a packaging process of an display device in accordance with an embodiment of the invention.
Figure 3B:
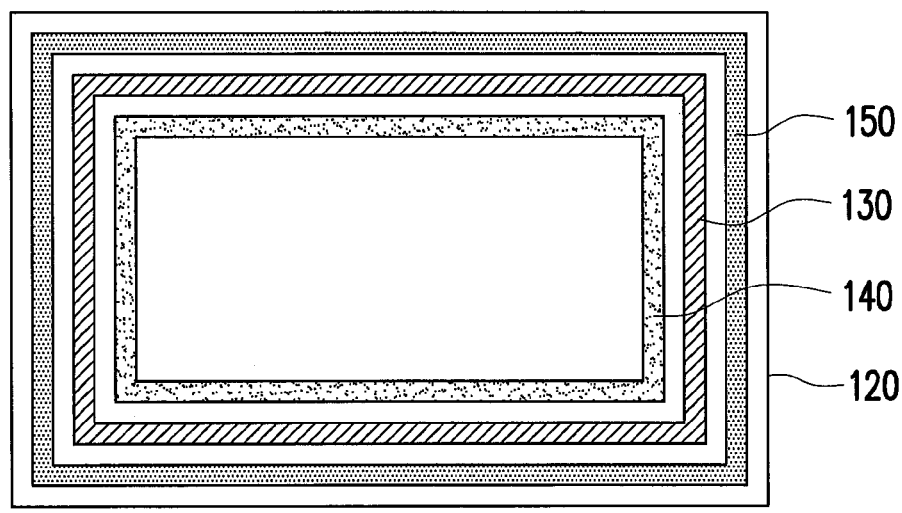
Figure 3C:
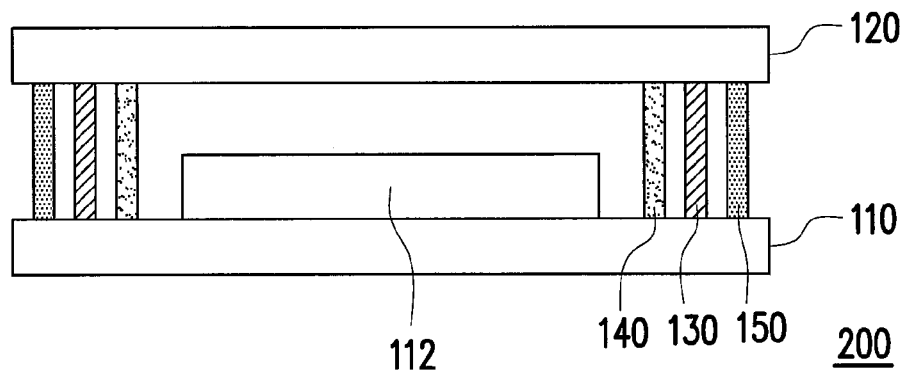

FIGS. 3A-3C are schematic views illustrating the steps of a packaging process of an display device in accordance with an embodiment of the invention. Referring to FIG. 3A, a first substrate 110 on which a display device 112 is formed is provided at first. In the present embodiment, the first substrate 110 with the display device 112 formed thereon is a flat panel display or a plane light source, for example. For instance, the first substrate 110 with the display device 112 formed thereon is exemplarily an active matrix organic electro-luminescent display panel (AM-OLED panel), a passive matrix organic electro-luminescent display panel (PM-OLED panel) or an electro-phoretic display panel (EPD panel).

Referring to FIG. 3B, thereafter a welding glue 130, an adhesive layer 140, and a second adhesive layer 150 is formed on a second substrate 120, in which the welding glue 130 is welded with the second substrate, and the welding glue 130 has a continuous pattern. More specifically, first a welding material (not drawn) is formed on the second substrate 120, and the welding material is then cured to form a welding glue 130 welded with the second substrate 120. After the welding material is cured, the first adhesive layer 140 and the second adhesive layer 150 are formed on the second substrate 120. The first adhesive layer 140 is formed insides of or enclosed by the welding glue 130, and the second adhesive layer 150 is formed on an outer side of the welding glue 130. Moreover, the second substrate 120 is, for example, a transparent substrate such as a glass substrate, a plastic substrate, or a substrate made of other suitable materials. The welding glue 130 is a glass frit, for example, and the welding glue 130 is cured by laser welding, for instance. The continuous pattern formed by the welding glue 130 is a closed pattern having a rectangular shape as shown in FIG. 1B or other suitable shapes. The first adhesive layer 140 exemplarily has a continuous pattern having a rectangular shape as shown in FIG. 1B or other suitable shapes. The material of the first adhesive layer 140 comprises a photo-curable material, a thermal curable material, or a self-curable material. The material of the welding glue 130 and the first adhesive layer 140 are exemplarily different from each other. The second adhesive layer 150 exemplarily has a continuous pattern having a rectangular shape as shown in FIG. 1B or other suitable shapes. The material of the second adhesive layer 150 comprises a photo-curable material, a thermal curable material, or a self-curable material. The material of the welding glue 130 and the second adhesive layer 150 are exemplarily different from each other. It should be noted that, embodiments of the invention do not restrict a formation sequence of the welding glue 130, the first adhesive layer 140, and the second adhesive layer 150, and the formation sequence may be modified according to design requirements. Furthermore, according to the present embodiment, although the first adhesive layer 140 and the second adhesive layer 150 exemplarily have the continuous patterns, but in other embodiments of the invention, the first adhesive layer 140 and the second adhesive layer 150 may have discontinuous patterns, and the discontinuous patterns may include three or more openings. Detailed description of the discontinuous pattern is provided later below.

Referring to FIG. 3C, thereafter the welding glue 130, the first adhesive layer 140, and the second adhesive layer 150 are adhered to the first substrate 120. The first substrate 120 is joined to the second substrate 110 with at least one of the welding glue 130, the first adhesive layer 140, and the second adhesive layer 150. The welding glue 130, the first adhesive layer 140, and the second adhesive layer 150 surround the display device 112. The first adhesive layer 140 is disposed between the display device 112 and the welding glue 130, whereas the welding glue 130 is disposed between the first adhesive layer 140 and the second adhesive layer 150. In the present embodiment, the welding glue 130, the first adhesive layer 140, and the second adhesive layer 150 may be adhered to the first substrate 110 by first curing the first adhesive layer 140 and the second adhesive layer 150, so that the second substrate 120 is adhered to the first substrate 110. After the first adhesive layer 140 and the second adhesive layer 150 are cured, the welding glue 130 is melted to be welded with the first substrate 110. According to the material characteristic of the first adhesive layer 140 and the second adhesive layer 150, the first adhesive layer 140 and the second adhesive layer may be cured by an irradiation process, a heating process, a desiccating process, or other suitable processes. The welding glue 130 is melted to be welded with the first substrate 110 by a laser irradiation process, for example. In other words, according to the present embodiment, by first curing the first adhesive layer 140 and the second adhesive layer 150 so that the first substrate 110 and the second substrate 120 are slightly adhered, then melting the welding glue 130 to weld the welding glue 130 with the first substrate 110, an adhesion between the first substrate 110 and the second substrate 120 is further strengthened. An advantage of curing the first adhesion layer 140 and the second adhesive layer 150 as well as melting the welding glue 130 in the above-described order is that, during the process of curing the first adhesive layer 140 and the second adhesive layer 150 to adhere the first substrate 110 and the second substrate 120, the welding glue 130 can maintain a cell gap between the first substrate 110 and the second substrate 120 because the welding glue is cured in a previous step. Moreover, in the process of welding the welding glue 130 with the first substrate 110, the cured first adhesive layer 140 and the cured second adhesive layer 150 can maintain the cell gap between the first substrate 110 and the second substrate 120. Accordingly, the issue of an irregular cell gap produced during the adhesion process of the first substrate 110 and the second substrate 120 may be mitigated.

Figure 4A:
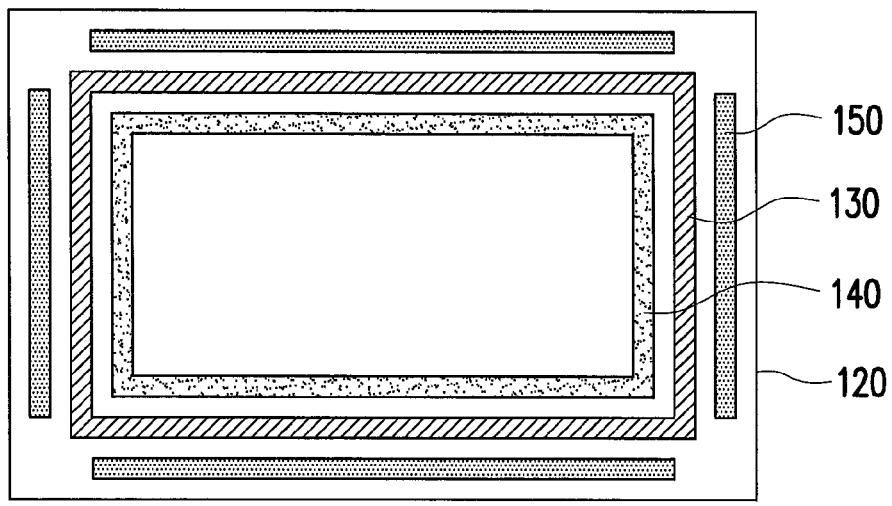
FIGS. 4A-4E are respective schematic top views of a second substrate of an display device package in accordance with an embodiment of the invention.
Figure 4B:
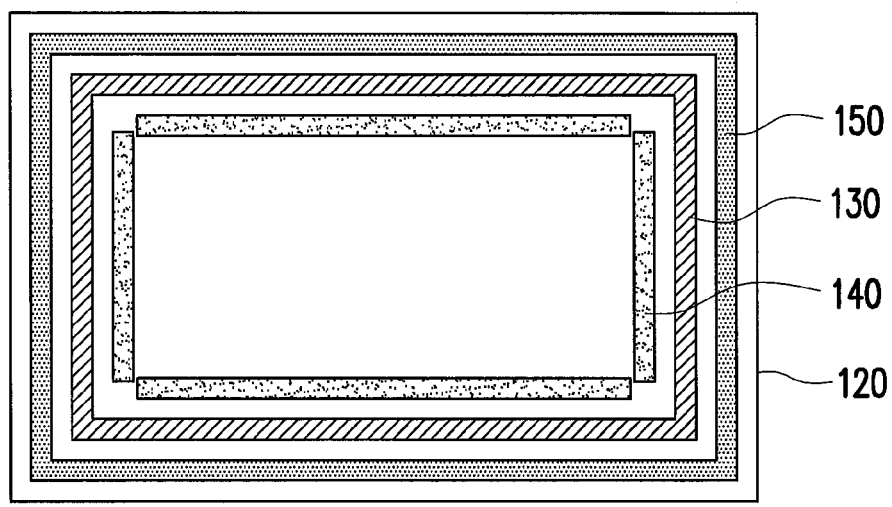
Figure 4C:
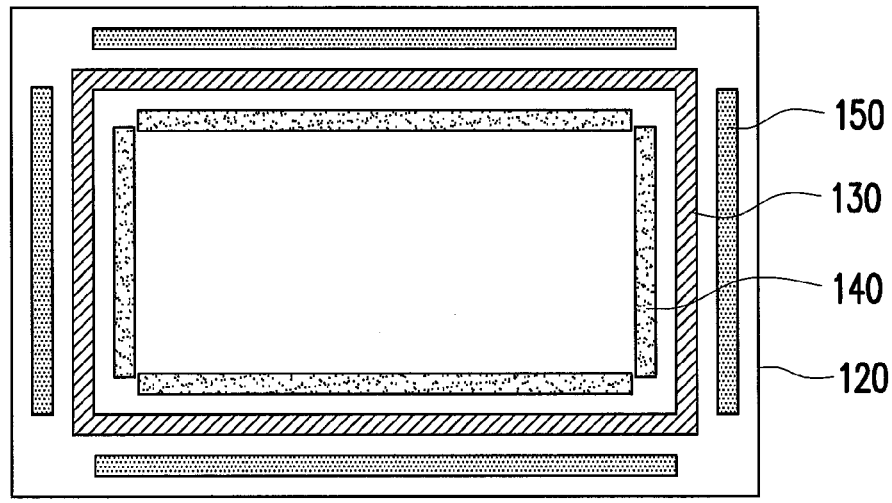
Figure 4D:
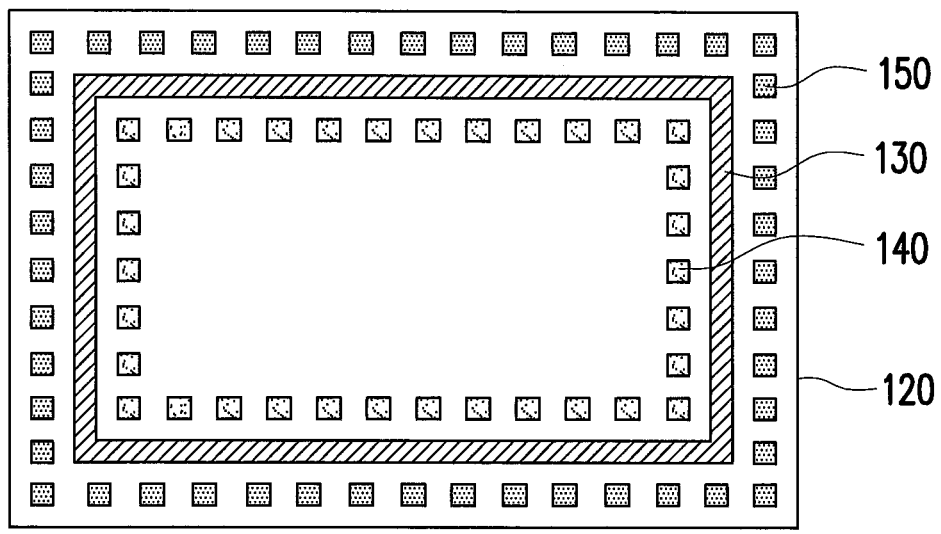
Figure 4E:
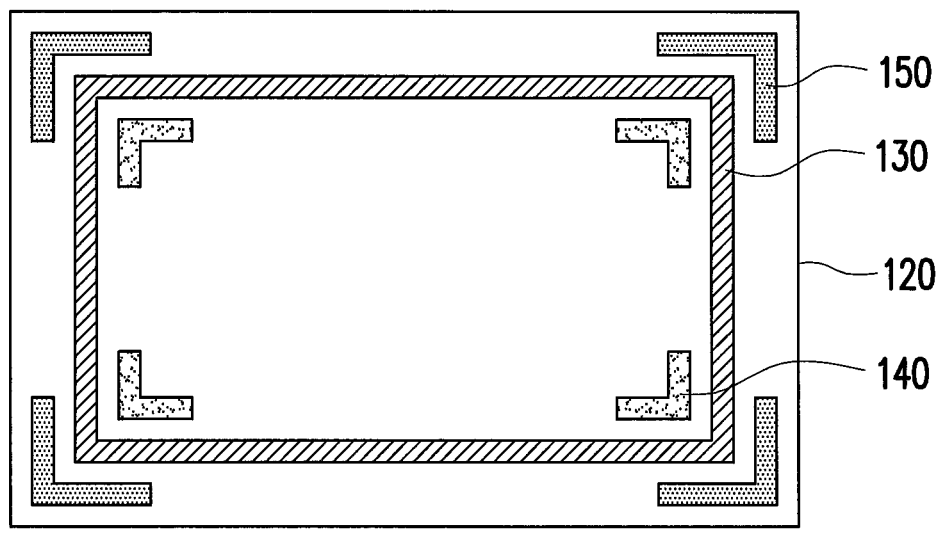

Referring to FIGS. 3B and 3C, a display device package 200 includes the first substrate 110, the display device 112, the second substrate 120, the welding glue 130, the first adhesive layer 140, and the second adhesive layer 150. The display device 112 is disposed on the first substrate 110. The second substrate 120 is disposed above the first substrate 110 and the display device 112. The welding glue 130 welds with the first substrate 110 and the second substrate 120, and the welding glue 130 surrounds the display device 112. Moreover, the welding glue 130 has a continuous pattern. The first adhesive layer 140 and the second adhesive layer 150 are adhered to the first substrate 110 and the second substrate 120, in which the first adhesive layer 140 is disposed between the display device 112 and the welding glue 130, and the first adhesive layer 140 surrounds the display device 112. The welding glue 130 is disposed between the second adhesive layer 150 and the display device 112. It should be noted that, according to the present embodiment, although the first adhesive layer 140 and the second adhesive layer 150 exemplarily have the continuous patterns, but in other embodiments of the invention, the first adhesive layer 140 and the second adhesive layer 150 may have discontinuous patterns, and the discontinuous patterns may include three or more openings. Therefore, the patterns of the first adhesive layer 140 and the second adhesive layer 150 may be a plurality of combined patterns. For example, as shown in FIG. 4A, on the second substrate 120 of the display device package 200 according to an embodiment of the invention, the first adhesive layer 140 has a continuous pattern, whereas the second adhesive layer 150 has a discontinuous pattern, and the discontinuous pattern includes a plurality of strip patterns, for example. As shown in FIG. 4B, on the second substrate 120 of the display device package 200 according to an embodiment of the invention, the first adhesive layer 140 can have a discontinuous pattern, and the discontinuous pattern includes a plurality of strip patterns, for example, whereas the second adhesive layer 150 has a continuous pattern. As shown in FIGS. 4C-4E, on the second substrate 120 of the display device package 200 according to an embodiment of the invention, both the first adhesive layer 140 and the second adhesive layer 150 have discontinuous patterns, and the discontinuous patterns include, for example, a plurality of strip patterns, a plurality of dot patterns, a plurality of L-shaped patterns, or other suitable patterns. In other words, embodiments of the invention do not limit the patterns of the first adhesive layer 140 and the second adhesive layer 150.

In the present embodiment, the display device package 200 employs the welding glue 130, the adhesive layer 140, and the second adhesive layer 150 to adhere the first substrate 110 and the second substrate 120, so as to strengthen the adhesion between the substrates 110 and 120 and the welding glue 130. Accordingly, moisture can be effectively prevented from entering the display device package 200, and thereby the display device 112 may obtain a preferable electrical characteristic. Moreover, the substrates 110 and 120 generally have a property of thermal expansion or contraction due to heat or cold, therefore, after the welding glue 130 is laser welded for example, a stress may still reside in the adhesion interface between the welding glue 130 and the substrates 110 and 120, thereby effecting the adhesion of the welding glue 130 between the substrates 110 and 120, and even causing the failure of the package. However, in the present embodiment, since the adhesive layer 140 is formed inside of the welding glue 130, and the second adhesive layer 150 is formed on an outer side of the welding glue 130, the first adhesive layer 140 and the second adhesive layer 150 may act as buffers against the thermal expansion and contraction of the substrates 110 and 120, so as to reduce the influence on the adhesion of the welding glue 130 between the substrates 110 and 120, and to increase a total adhesion area with the substrates 110 and 120. Therefore, the adhesion of the substrates 110 and 120 and the welding glue 130 is drastically increased, while a failure possibility of the package is lowered. Furthermore, due to the larger total adhesion area of the welding glue 130, the first adhesive layer 140, and the second adhesive layer 150 between the substrates 110 and 120, a preferable supportability is provided for the substrates 110 and 120. Hence, when the display device package 200 according to the present embodiment is applied in a large scale product, the upper and lower substrates are prevented from scratching and damaging the display device due to insufficient supportability. In other words, the display device package in the present embodiment may also increase the yield rate and the reliability.

Figure 5A:
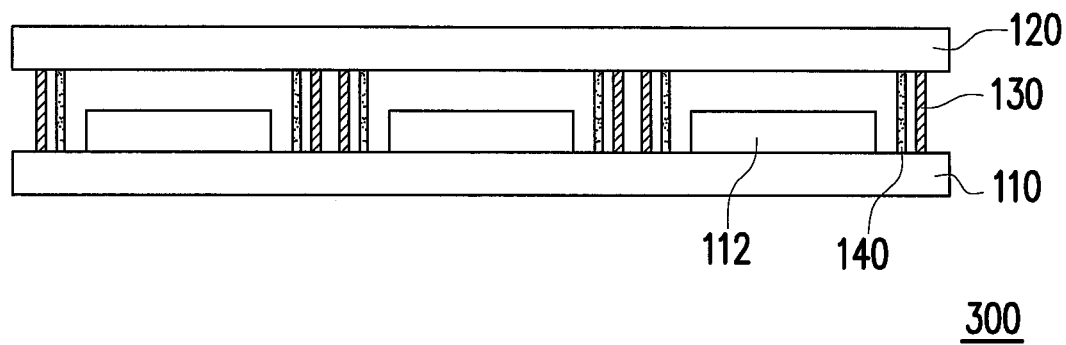
FIG. 5A is a schematic cross-sectional view of a display device package array in accordance with an embodiment of the invention.
Figure 5B:
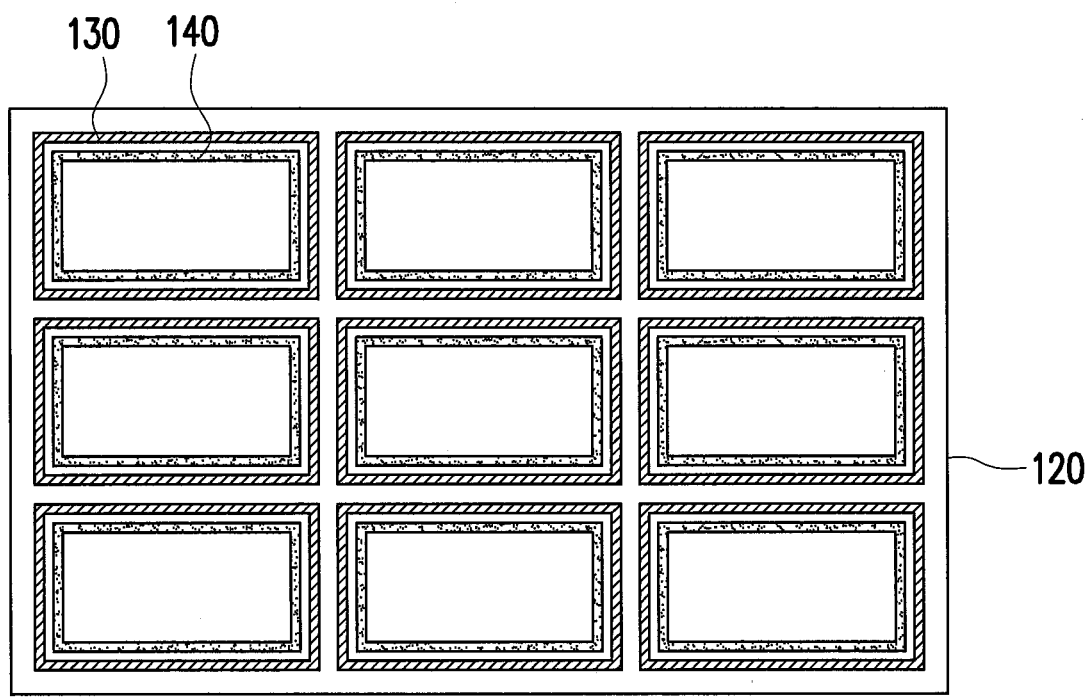
FIG. 5B is a schematic top view of a second substrate depicted in FIG. 5A.

FIG. 5A is a schematic cross-sectional view of a display device package array in accordance with an embodiment of the invention. FIG. 5B is a schematic top view of a second substrate depicted in FIG. 5A. Referring to FIGS. 5A and 5B, a display device package array 300 includes the first substrate 110, one or more display devices 112, the second substrate 120, the welding glue 130, and the first adhesive layer 140. In the present embodiment, the display devices 112 are disposed on the first substrate 110. The second substrate 120 is disposed above the first substrate 110 and the display devices 112. The welding glue 130 welds with the first substrate 110 and the second substrate 120, and the welding glue 130 surrounds the display devices 112. Moreover, the welding glue 130 has a continuous pattern. The first adhesive layer 140 is adhered to the first substrate 110 and the second substrate 120, in which the first adhesive layer 140 is disposed between the display devices 112 and the welding glue 130, and the first adhesive layer 140 surrounds the display devices 112. It should be noted that, according to the present embodiment, although the welding glue 130 and the first adhesive layer 140 has the pattern depicted in FIG. 1C, but the welding glue 130 and the first adhesive layer 140 may have the pattern depicted in FIG. 2A or FIG. 2B. Alternatively, in another embodiment of the invention, the display device package array may include the second adhesive layer. Moreover, the welding glue 130, the first adhesive layer 140, and the second adhesive layer 150 have the pattern depicted from FIGS. 4A-4E. Furthermore, since components of the display device array 300 are mostly the same as the above-described display device packages 100 and 200, the detailed description thereof can be referred to the aforementioned, and thus are omitted herein.

In the present embodiment, since the display device package array 300 adheres the first substrate 110 and the second substrate 120 by using the welding glue 130 and the adhesive layer 140, moisture is effectively prevented from entering the display device package array 300, so that the display devices 112 have a preferable electrical characteristic. Moreover, after the welding glue 130 is welded by laser welding, for example, due to the thermal expansion and contraction property of the substrates 110 and 120, a stress may still reside in the adhesion interface between the substrates 110 and 120 and the welding glue 130. The adhesive layer 140 may act as a buffer against this stress, so as to reduce the influence on the adhesion between the welding glue 130 and the substrates 110 and 120, and to increase a total adhesion area with the substrates 110 and 120. Additionally, by adopting the use of the welding glue 130 and the adhesive layer 140, a preferable supportability for the substrates 110 and 120 is provided, thus preventing the upper and lower substrates 110 and 120 from scratching and damaging the display devices 112. Thereby, a yield and a reliability of the display device package array 300 are enhanced.

In light of the foregoing description, according to embodiments of the invention, the display device package employs the welding glue and the adhesive layer to adhere the first substrate and the second substrate, so as to strengthen the adhesion between the substrates and the welding glue. Accordingly, moisture can be effectively prevented from entering the display device package, and thereby the display device may obtain a preferable electrical characteristic. Moreover, after the welding glue is welded by laser welding, for example, due to the thermal expansion and contraction property of the substrates, a stress may still reside in the adhesion interface between the substrates and the welding glue. The adhesive layer may act as a buffer against this stress, so as to reduce the influence on the adhesion between the welding glue and the substrates, and to increase a total adhesion area with the substrates. Additionally, by adopting the use of the welding glue and the adhesive layer, a preferable supportability for the substrates is provided, thus preventing the upper and lower substrates from scratching and damaging the display device. Thereby, the yield and the reliability of the display device package are enhanced.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A packaging process of a display device, comprising:
   providing a first substrate having a display device formed thereon;
   curing a welding material so as to form a welding glue on the second substrate;
   forming a first adhesive layer and a second adhesive layer on a second substrate after the welding material is cured, wherein the welding glue is a glass frit, the first adhesive layer is substantially disposed between the display device and the glass frit, and a material of the first adhesive layer is different from a material of the glass frit, the glass frit is disposed between the second adhesive layer and the first adhesive layer, a material of the second adhesive layer is different from a material of the glass frit, and the welding glue, the first adhesive layer, and the second adhesive layer are formed on a planar surface of the second substrate;
   after the step of forming the first adhesive layer and the second adhesive layer on the second substrate, curing the first adhesive layer and the second adhesive layer so that the glass frit contacts both of the first substrate and the second substrate, and the second substrate is adhered to the first substrate to maintain a cell gap therebetween; and
   after the step of curing the first adhesive layer and the second adhesive layer, melting the glass frit by a laser irradiation process to strengthen an adhesion between the first substrate and the second substrate.

2. The packaging process of the display device as claimed in claim 1, wherein a material of the first adhesive layer comprises a photo-curable material, a thermal curable material, or a self-curable material, and a material of the second adhesive layer comprises a photo-curable material, a thermal curable material, or a self-curable material.

3. The packaging process of the display device as claimed in claim 1, wherein a material of one of the first and second substrates is glass or plastic.

* * * * *